United States Patent
Kwon

(10) Patent No.: US 8,303,756 B2
(45) Date of Patent: Nov. 6, 2012

(54) METHOD FOR BONDING A GLASS CAP AND MASK FOR CURING SEALANT

(75) Inventor: Seung Ho Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1112 days.

(21) Appl. No.: 11/126,260

(22) Filed: May 11, 2005

(65) Prior Publication Data
US 2006/0121363 A1 Jun. 8, 2006

(30) Foreign Application Priority Data

Dec. 7, 2004 (KR) .................. 10-2004-0102425
Dec. 8, 2004 (KR) .................. 10-2004-0102865
Dec. 8, 2004 (KR) .................. 10-2004-0102866
Dec. 8, 2004 (KR) .................. 10-2004-0102867

(51) Int. Cl.
*B32B 37/00* (2006.01)

(52) U.S. Cl. .................. 156/272.2; 430/5; 65/43

(58) Field of Classification Search .......... 430/5; 65/43; 156/272.2, 250
See application file for complete search history.

(56) References Cited

U.S. PATENT DOCUMENTS

| | | | | |
|---|---|---|---|---|
| 3,567,447 | A * | 3/1971 | Chand ................. | 430/5 |
| 5,030,317 | A * | 7/1991 | Noguchi ............... | 216/27 |
| 6,428,650 | B1 * | 8/2002 | Chung ................. | 156/250 |
| 6,521,482 | B1 * | 2/2003 | Hyoudo et al. ........ | 438/110 |
| 2003/0129916 | A1 * | 7/2003 | Lee ..................... | 445/25 |
| 2003/0228528 | A1 * | 12/2003 | Mitsui et al. ......... | 430/5 |
| 2005/0036090 | A1 * | 2/2005 | Hayashi et al. ....... | 349/122 |

FOREIGN PATENT DOCUMENTS

| | | |
|---|---|---|
| JP | 3-271738 A | 12/1991 |
| JP | 6-59435 A | 3/1994 |
| JP | 2001-319776 A | 11/2001 |
| JP | 2001319776 A * | 11/2001 |
| JP | 2003-007457 A | 1/2003 |
| JP | 2003-32042 A | 1/2003 |
| JP | 2003-297555 A | 10/2003 |
| JP | 2004-018333 A | 1/2004 |
| JP | 2004018333 A * | 1/2004 |
| JP | 2004-139767 A | 5/2004 |
| JP | 2004-303425 A | 10/2004 |
| KR | 2003-0068425 A | 8/2003 |

OTHER PUBLICATIONS

Machine Translation of JP 2004018333 A, Jan. 22, 2004.*

* cited by examiner

*Primary Examiner* — Daniel McNally
(74) *Attorney, Agent, or Firm* — Birch, Stewart, Kolasch & Birch, LLP

(57) ABSTRACT

The method for bonding a glass cap according to the present invention comprises the steps of, forming a plurality of recesses on a side of a glass corresponding to a substrate; forming a plurality of light non-transmittable layers on a surface of the glass opposite to a surface corresponding to the substrate; dispensing a sealant on a substrate-bonding region of the glass or on a cap-bonding region of the substrate; bonding the glass to the substrate in the state that each active area formed on the substrate is received in each recess of the glass; curing the sealant dispensed on the sealing-dispensing region by irradiating ultraviolet rays to a side of the glass to which the substrate is not bonded; and dicing the bonded glass and substrate to make the individual devices. The present invention intercepts the ultraviolet rays irradiated to the active areas of the substrate to protect the active areas, and so can cure completely the sealant dispensed on the metal lines.

2 Claims, 4 Drawing Sheets

METHOD FOR BONDING A GLASS CAP AND MASK FOR CURING SEALANT

FIELD OF THE INVENTION

The present invention relates to a method for bonding a glass cap and a mask for curing a sealant, particularly to a method for bonding a glass cap which can cure a dispensed sealant completely without any damage to active areas formed on a substrate, and a mask for curing a sealant used therein.

BACKGROUND OF THE INVENTION

Organic electroluminescence is the phenomenon which excitons are formed in an (low molecular or high molecular) organic material thin film by re-combining holes injected through an anode with electrons injected through a cathode, and light with specific wavelength is generated by energy from the formed excitons.

Organic electroluminescent device using the above phenomenon has a basic structure as illustrated in FIG. 1.

The basic structure of the organic electroluminescent device includes a glass substrate 1, an indium-tin-oxide layer 2 (hereinafter, referred as "ITO layer") formed on the upper side of the glass substrate 1 and acting as anode electrode, an insulating layer, an organic material layer 3, and a metal layer 4 acting as cathode electrode in the order. Walls W are formed to deposit the metal layers 4 separately on the ITO layer 2.

FIG. 2 is a plane view of the organic electroluminescent device shown in FIG. 1. For convenience, FIG. 2 shows a state that a cap 6 in FIG. 1 is removed from the device. As shown in FIG. 2, a plurality of ITO layers 2 and a plurality of metal layers 4 formed in an active area A are extended to the outer portion of the active area A, and each end portion of the layers 2 and 4 are concentrated on a part of the substrate 1 to form a pad P.

After the active area A consisted of the elements 2, 3, 4 and W is formed on the substrate 1 through the process as described above, the cap 6 is bonded to the substrate 1 by means of a sealant 5. The region to which the cap 6 is bonded is the outer portion of the substrate, that is, the outer region S1 and S2 of the active area A of the substrate 1. The entire active area A is isolated completely from the exterior by the cap 6, and only the pad P on which the ITO layers 2 (data lines) and the metal layers 4 (scan lines) extended to the outer portion of the active area A are concentrated is exposed to the exterior.

As shown in FIG. 1, a closed space is formed between the cap 6 and the substrate 1. The elements 2, 3, 4 and W placed in this space are not influenced by outer environment such as moisture and the like. On the other hand, the cap 6 is made from metal or glass, ultraviolet rays-curable adhesive is used as sealant 5. Also, a getter 8, which is moisture absorbent, is attached to a lower surface of a central portion of the cap 6 by a tape 7 made from organic material.

A process for bonding the metal cap 6 to the substrate 1 as described above is briefly described below with reference to FIG. 1, FIG. 2 and FIG. 3.

After the getter is attached to each of the metal caps 6 loaded in a cap tray (not shown), the sealant is dispensed on a substrate bonding-region (circumference surface) of the cap 6. After the cap 6 and the substrate 1 are aligned, the cap 6 is bonded to the region S1 and S2 formed at the outside of the active area A formed on the substrate 1. In order to bond the cap 6 securely to the substrate, ultraviolet rays are irradiated selectively on the cap-bonding region S1 and S2 of the substrate 1 to cure the sealant S. At this time, since the cap 6 is made from metal material which ultraviolet rays cannot penetrate, ultraviolet rays are irradiated to the glass substrate 1.

On the other hand, if ultraviolet rays are irradiated to the active area A, a threshold voltage of a drive transistor in the active matrix device is changed, and organic material in the passive matrix device is damaged to cause serious effect to the luminous function of the device.

In order to solve these problems, it is desirable that ultraviolet rays are not irradiated to the active area A of the substrate. Thus, a mask for curing the sealant is used to irradiate ultraviolet rays selectively to the substrate (portion corresponding to the sealant).

FIG. 3 is a view showing a relation between the mask used in the process for curing the sealant and the organic electroluminescent device. For convenience, only two organic electroluminescent devices (hereinafter, refer to as "device") are shown in FIG. 3 and the other elements except the active area A are not shown therein.

The mask m used for curing the sealant is made from quartz having lower refractive index than glass, and a plurality of light non-transmittable layers m1 consisted of molybdenum (Mo) thin film or chrome (Cr) thin film are formed on corresponding areas to the active areas A formed on the substrate 10. On the other hand, in a process for bonding the caps loaded on a cap tray (not shown) to the substrate, a certain pressure is applied to the substrate 1, and this pressure is transmitted to the mask m which is contacted with the substrate 1. Therefore, in order to prevent transformation by such pressure, the mask m should have certain thickness.

Ultraviolet rays generated at an ultraviolet lamp (not shown) situated above the mask m penetrates the mask m, and then are irradiated onto the substrate 1. The ultraviolet rays penetrate the glass substrate 1 to cure the sealant. In the above process, on the other hand, the ultraviolet rays reach, but cannot penetrate the light non-transmittable layers m1. Therefore, the ultraviolet rays cannot reach the active areas A of the substrate 1 corresponding to the light non-transmittable layers m1.

Assuming that the ultraviolet rays penetrating the mask m are irradiated perpendicularly onto the substrate 1, the ultraviolet rays to be irradiated to each active area A can be completely intercepted by using the mask m on which the light non-transmittable layers m1 are formed. However, as shown in FIG. 4, it would be ideal for the ultraviolet rays penetrating the mask m to be irradiated perpendicularly onto the substrate 1 (a in FIG. 4), but such ideal radiation of ultraviolet rays is difficult to expect due to the structure of the ultraviolet generating device.

That is, in the ultraviolet generating device, the ultraviolet rays emitted from a light source are reflected on a glass plate which is one of the members constituting the ultraviolet generating device, and then irradiated to the mask m. Accordingly, the ultraviolet rays which are diffusively reflected on the glass plate are irradiated to the mask m with various angles of reflection.

Once the diffused ultraviolet rays are irradiated to the mask m which is made from quartz and has a certain thickness with a certain incident angle, the ultraviolet rays are refracted at the surface of the mask m, and then irradiated to the active area A of the substrate 1 (b in FIG. 4). Also, although the ultraviolet rays are irradiated in a direction perpendicular to the mask m, the ultraviolet rays can be refracted at the surface of the mask m, and then irradiated to the active area A of the substrate 1 (c in FIG. 4).

For the above reasons, the ultraviolet rays irradiated to the active area A have serious effect to the device's function.

Therefore, the mask is needed to prevent the ultraviolet rays from being irradiated to the active area A in the process for curing the sealant.

On the other hand, the metal lines extended from the ITO layers (2 in FIG. 1) and the metal layers (4 in FIG. 1) in the active area A are formed on the region S1 and S2 to which the cap 6 is bonded, and so some of the ultraviolet rays penetrating the mask m are intercepted by the metal lines so that the ultraviolet cannot be irradiated to the sealant S.

Also, in this region S1 and S2 (in FIG. 2), the sealant 6 dispensed on the metal lines is not cured completely. Consequently, in order to cure the sealant completely, it is desirable to minimize the width of the metal lines in the regions S1 and S2 (in FIG. 2) to which the cap 6 is bonded.

Also, in case that the ultraviolet rays are irradiated to the substrate 1 by using the mask m, the precise alignment is needed between the mask m and the substrate 1 (that is, cap 6).

SUMMARY OF THE INVENTION

Accordingly, an object of the present invention is to resolve the above needs in the process for curing the sealant used for bonding the metal cap to the substrate, and to provide a method for bonding a glass cap which can irradiate ultraviolet rays only to sealant-dispensing region of a substrate without using a mask and can cure a sealant dispensed on metal lines completely.

Another object of the present invention is to provide a mask for bonding a glass cap which can intercept effectively the ultraviolet rays irradiated to active areas formed on the substrate to protect the active areas.

A method for bonding a glass cap according to the present invention comprises the steps of forming a plurality of recesses on a side of a glass corresponding to a substrate; forming a plurality of light non-transmittable layers on a surface of the glass opposite to a surface corresponding to the substrate; dispensing a sealant on a substrate-bonding region of the glass or on a cap-bonding region of the substrate; bonding the glass to the substrate in the state that each active area formed on the substrate is received in each recess of the glass; curing the sealant dispensed on the sealing-dispensing region by irradiating the ultraviolet rays to a side of the glass to which the substrate is not bonded; and dicing the bonded glass and substrate to make the individual devices.

The light non-transmittable layers are one-to-one corresponded to the active areas formed on the substrate and each of the plurality of light non-transmittable layers is chrome or molybdenum thin film formed through sputtering or sand blasting process.

Another method for bonding a glass cap according to the present invention comprises the steps of dispensing a sealant on a substrate-bonding region of a glass on which a plurality of recesses are formed or a cap-bonding region of a substrate; bonding the glass to the substrate in the state that each active area formed on the substrate is received in each recess of the glass; placing a mask for curing the sealant above the glass and irradiating the ultraviolet rays selectively to the sealant dispensing region through the mask to cure the sealant; and dicing the bonded glass and substrate to make the individual devices.

The mask is made from quartz and a plurality of light non-transmittable layers are formed on a surface corresponding to the glass, each corresponding to the active areas of the substrate.

Also, the light non-transmittable layers can be formed on a first surface corresponded to the glass and a second surface which is opposite to the first surface, and the light non-transmittable layers correspond to the active areas of the substrate.

Further, it is desirable that the width (area) of each light non-transmittable layer formed on the first surface is larger than that of each second light non-transmittable layer formed on the second surface.

The mask for curing a sealant according to the present invention is applicable to a process for bonding metal caps to a substrate. In this case, the mask can protect active areas formed on the substrate by intercepting some of ultraviolet rays to be irradiated to the substrate.

BRIEF DESCRIPTION OF THE DRAWINGS

The present invention will be more clearly understood from the detailed description in conjunction with the following drawings.

DETAILED DESCRIPTION OF THE INVENTION

Figure 1:
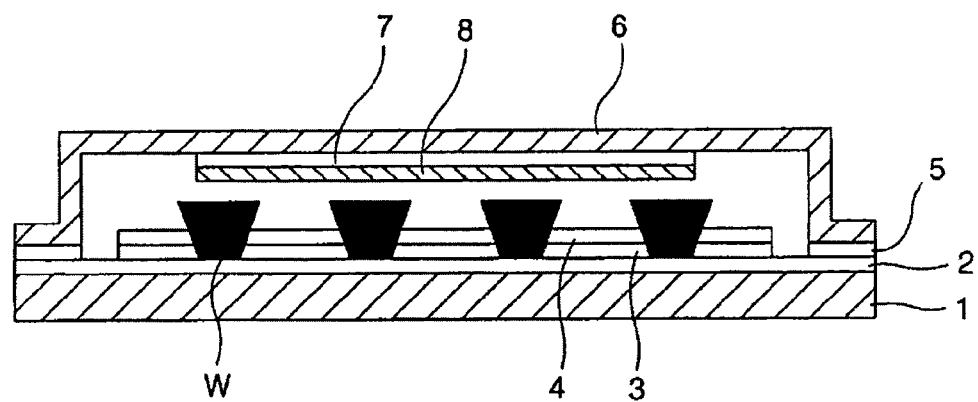
FIG. 1 is a sectional view showing schematically the basic structure of an organic electroluminescent device.

Hereinafter, the embodiments of the present invention will be described in detail with reference to those accompanying drawings. The same reference numerals are used throughout the drawings to indicate same or similar elements.

First Embodiment

Figure 5:
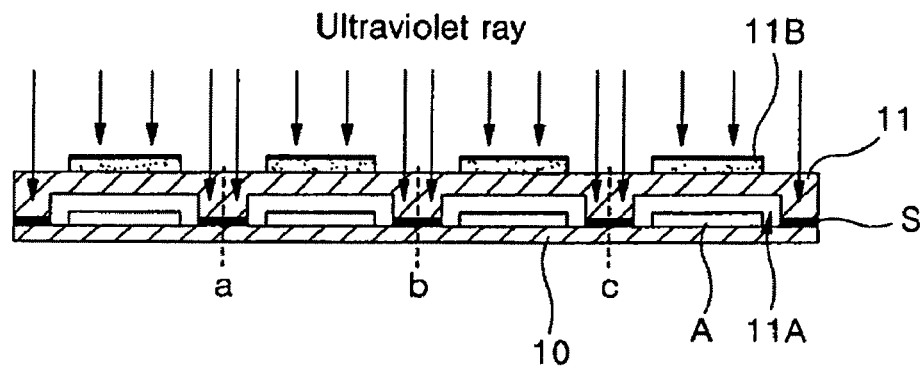
FIG. 5 is a view showing a relation between the glass and substrate for illustrating a method for bonding a cap according to the first embodiment of the present invention.

FIG. 5 is a view showing a relation between the glass and substrate for illustrating a method for bonding a glass cap according to the first embodiment of the present invention, and shows a substrate 10 on which a plurality of active areas A are formed, and a single glass 11. A plurality of recesses 11A are formed on the glass 11 to receive corresponding active area A formed on the substrate 10.

The method for bonding a glass cap according to this embodiment is described below.

First of all, a plurality of light non-transmittable layers 11B are formed on the upper surface (opposite to a surface corresponding to the substrate 10) of the glass 11 used for forming a glass cap. The light non-transmittable layers 11B are chrome-coating layers or molybdenum-coating layers formed through sputtering or sand blasting process, each of the light non-transmittable layers 11B corresponds to each of the active areas A formed on the substrate 10.

Figure 2:
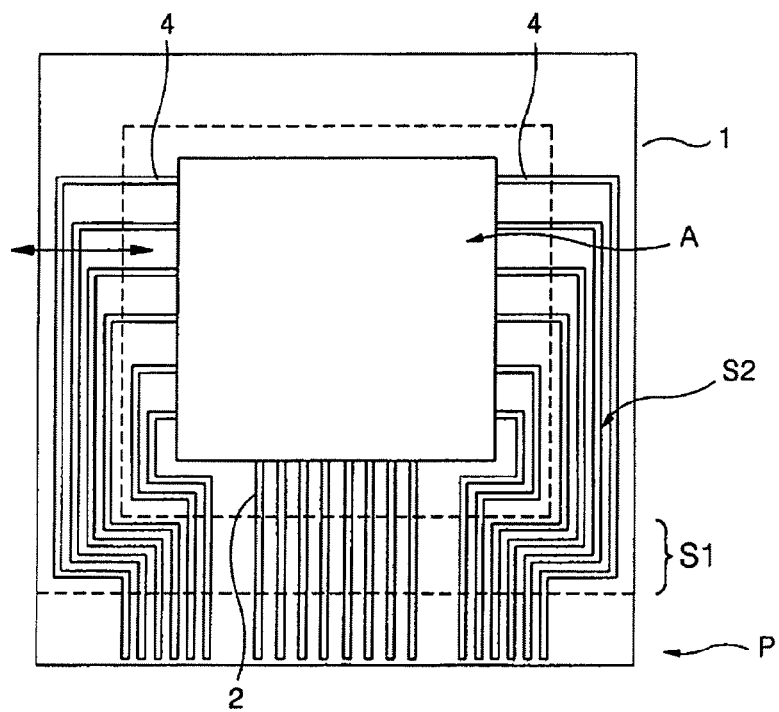
FIG. 2 is a plane view of the organic electroluminescent device shown in FIG. 1 from which a cap is removed.

A getter (not shown) is attached to the bottom surface of each recess 11A formed on the glass 11, and a sealant S is then dispensed on a substrate-bonding region (periphery surface of the recesses 11A) of the glass 11 or a cap-bonding region S1 and S2 (in FIG. 2) of the substrate 10.

After the sealant S is dispensed, the glass 11 and the substrate 10 at the corresponding state are bonded to the state that each active area A formed on the substrate 10 is received into each recess 11A of the glass 11.

In this state, ultraviolet rays are irradiated to the upper side of the glass 11 (opposite to the substrate-corresponding side) to cure the dispensed sealant S, and then the bonded glass 11 and substrate 10 is diced to make the individual devices. At this time, each diced glass functions as individual glass cap which seals each active area A of the substrate 10.

In the above steps, the step for curing sealant by using ultraviolet rays is described in detail below.

Figure 3:
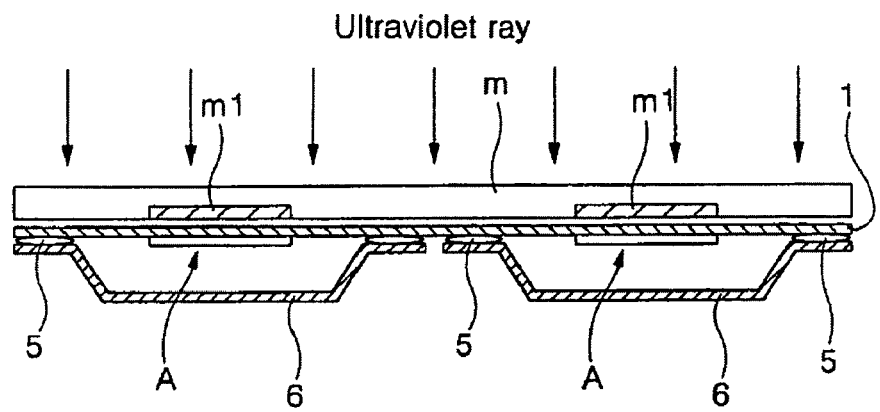
FIG. 3 is a view showing a relation between a conventional mask used in a process for curing a sealant and the organic electroluminescent device.

Contrary to metal, ultraviolet rays can penetrate glass. Thus, after the glass 11 is bonded to the substrate 10, there is no need to change the position of the substrate 10 and glass 11 to direct the substrate 10 toward the ultraviolet generating device as shown in FIG. 3, in order to cure the sealant S dispensed on the cap-bonding region (S1 and S2 in FIG. 2) of the substrate 10.

On the other hand, a plurality of light non-transmittable layers 11B, each corresponding to the active areas A formed on the substrate 10, are formed on the upper surface (opposite to the surface corresponding to the substrate 10) of the glass 11 used for forming the glass cap.

Accordingly, ultraviolet rays cannot penetrate the light non-transmittable layers 11B of the glass 11, and so the ultraviolet rays penetrating other region than the light non-transmittable layers 11B are irradiated to the sealant-dispensed region to cure sealant S. At this time, metal lines (2 and 4 in FIG. 2) extended from the ITO layers and the metal layers are formed on the cap-bonding region (S1 and S2 in FIG. 2) of the substrate 10, and the sealant S is dispensed on the metal lines 2 and 4. Thus, ultraviolet rays are irradiated to the sealant S without any influence of the metal lines. Therefore, the dispensed sealant S is completely cured by ultraviolet rays, and the glass 11 and the substrate 10 can maintain secure adhesion state.

As described above, on the other hand, in each active area A of the substrate 10, the metal layer (4 in FIG. 4) is deposited on the organic material layer (3 in FIG. 1). Thus, in the present invention in which ultraviolet rays are irradiated to the glass 11 corresponding to the ultraviolet lamp, the organic material layer is not exposed to ultraviolet rays by the metal layer. As a result, any damage to the organic material layer caused by ultraviolet rays can be prevented.

After the process for curing the sealant is completed, the substrate 10 and the glass 11 are diced at the specific positions (a, b and c in FIG. 5) to make a plurality of separate organic electroluminescent devices.

In the method of bonding the glass cap as described above, ultraviolet rays are irradiated to the glass 11 first at the state that the glass 11 is placed toward the ultraviolet source. Thus, the sealant S dispensed on the cap-bonding region S1 and S2 of the substrate 10 can be cured completely without any effect to the metal lines 2 and 4. Accordingly, some margin can be secured for the width of the metal lines 2 and 4 in the cap-bonding region S1 and S2 of the substrate 10. Also, the organic material layer is not damaged since it is not exposed to ultraviolet rays by the metal layer in each active area A.

Particularly, the light non-transmittable layers 11B, each corresponding to the active areas A formed on the substrate 10, are formed on the glass 11 itself, and so the active areas A can be protected from ultraviolet rays without using the mask during the process for curing the sealant, by which no further process is necessary to adjust alignment of the mask and the glass (and the substrate).

Second Embodiment

Figure 6:
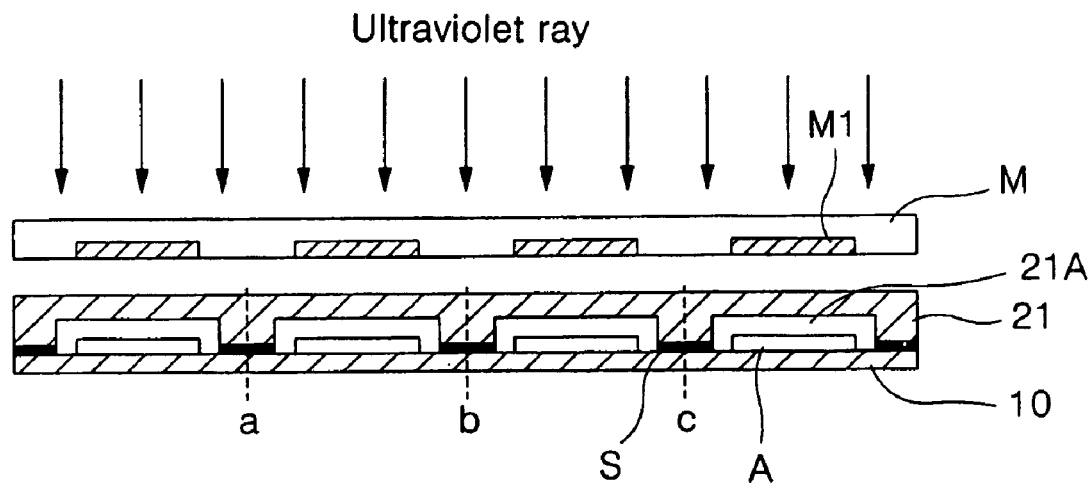
FIG. 6 is a view showing a relation between the glass and substrate for illustrating a method for bonding a cap according to the second embodiment of the present invention.

FIG. 6 is a view showing a relation of the mask M used for curing the sealant, the substrate 10, and the glass 20, to illustrate a method for bonding the glass cap according to the second embodiment of the present invention. On the other hand, the reference numerals in FIG. 5 will be used to indicate same elements in FIG. 6.

FIG. 6 shows the substrate 10 on which a plurality of active areas A are formed, and a single glass 21 on which a plurality of recesses 21A (for receiving each active area A of the substrate 10) are formed.

The method for bonding the glass cap according to this embodiment is described below.

First of all, each getter of absorbent is attached onto the bottom surface (the upper surface in FIG. 6) of recesses 21A formed on the glass 21, and then the sealant 6 is dispensed on the substrate-bonding region of the glass 21 (periphery surface of each recess 21A) or the cap-bonding region (S1 and S2 in FIG. 2) of the substrate 10.

After dispensing the sealant S, the glass 21 is pressed and bonded to the substrate 10 at the state that each active area A formed on the substrate 10 is received into each recess 21A of the glass 21.

In this state, a mask M for curing the sealant is placed on the upper side (opposite to the side corresponding to the substrate 10) of the glass 21, and then ultraviolet rays are irradiated to the mask M to cure the sealant S, and the bonded glass 21 and substrate 10 are diced to make separate devices. At this time, each diced glass 21 functions as the individual glass cap which seals each active area A of the substrate 10.

In the above steps, the step for curing the sealant by using ultraviolet rays will be explained in more detail, along with the mask M used therein.

Contrary to metal, ultraviolet rays can penetrate glass. Thus, after the glass 21 is bonded to the substrate 10, there is no need to change the position of the substrate 10 and the glass 21 to direct the substrate 10 toward the ultraviolet generating device as shown in FIG. 3, in order to cure the sealant S dispensed on the cap-bonding region (S1 and S2 in FIG. 2) of the substrate 10.

On the other hand, the mask M used for curing the sealant in this embodiment is made from quartz having lower refractive index than glass, and a plurality of light non-transmittable layers M1 consisted of molybdenum (Mo) thin film or chrome (Cr) thin film are formed on the surface corresponding to each active area A formed on the substrate 10.

The ultraviolet rays generated from an ultraviolet lamp (not shown) which is located above the mask M penetrate the mask M and are irradiated to the glass 21 to cure the sealant S. In this process, the ultraviolet rays reach, but cannot penetrate, the light non-transmittable layers M1 of the mask M. Thus, the ultraviolet rays do not reach each active area A of the substrate 10 corresponding to the light non-transmittable layers M1.

The ultraviolet rays penetrating other region of the mask M than the light non-transmittable layers M1 penetrate the glass 21 and are irradiated on the sealant-dispensed region, thereby curing the sealant S. At this time, the sealant S is located on the metal lines in the cap-bonding region (S1 and S2 of FIG. 2), and so the ultraviolet rays are irradiated on the sealant S without any effect to the metal lines. Accordingly, the entire sealant S dispensed on the cap-bonding region is completely cured by ultraviolet rays, and so the glass 21 and the substrate 10 can maintain secure adhesion state.

As shown in the first embodiment, on the other hand, in each active area A of the substrate 10, the metal layer (4 in FIG. 4) is deposited on the organic material layer (3 in FIG. 1). Thus, in the present invention which ultraviolet rays are irradiated to the glass corresponding to the ultraviolet lamp, the organic material layer is not exposed to ultraviolet rays by the metal layer. As a result, any damage of the organic material caused by ultraviolet rays can be prevented.

After the process for curing the sealant is completed, the bonded substrate 10 and glass 21 are diced at the specific positions (a, b and c in FIG. 6) to make a plurality of separate organic electroluminescent devices.

Third Embodiment

Figure 7:
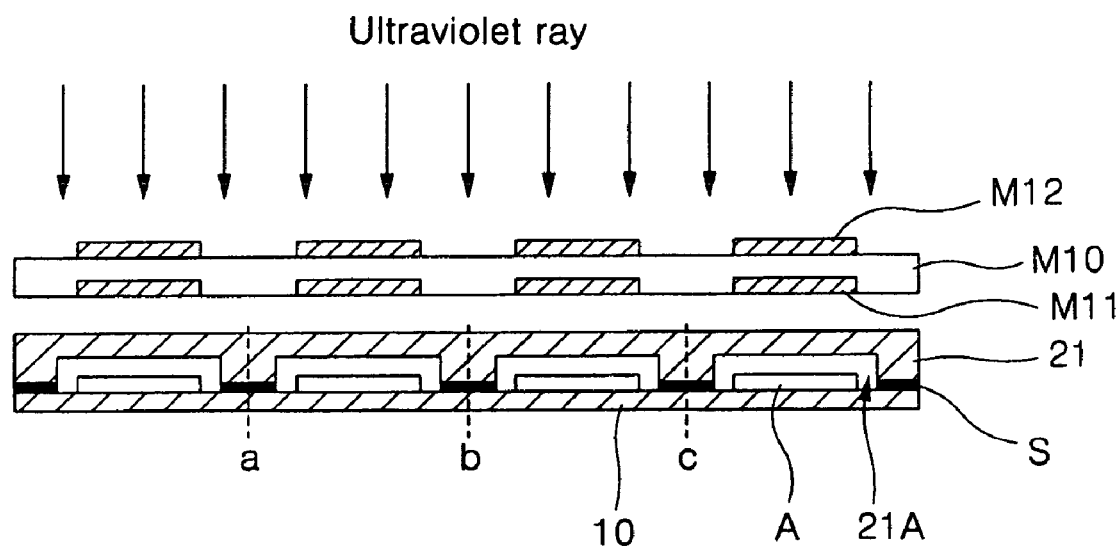
FIG. 7 is a view showing a relation between the glass and substrate for illustrating a method for bonding a cap according to the third embodiment of the present invention.

FIG. 7 is a view showing a relation of the mask used for curing the sealant, the substrate, and the glass, to illustrate a method for bonding the glass cap according to the third embodiment of the present invention. The same reference numerals are used for same elements in the first and second embodiments.

Also, FIG. 7 shows the substrate 10 on which a plurality of active areas A are formed, and a single glass 21 on which a plurality of recesses 21A (for receiving the corresponding active area A formed on the substrate 10) are formed.

The steps for bonding the glass cap according to the present embodiment are the same as those according to the second embodiment, except the mask. Thus, the description on the steps for bonding the glass and curing the sealant is omitted here, and the structure of the mask used in this embodiment will be described in more detail below.

Contrary to metal, ultraviolet rays can penetrate glass. Thus, after the glass 11 is bonded to the substrate 10, there is no need to change the position of the substrate 10 and the glass 11 to direct the substrate 10 toward the ultraviolet generating device as shown in FIG. 3, in order to cure the sealant S dispensed on the cap-bonding region (S1 and S2 in FIG. 2) of the substrate 10.

On the other hand, the mask M10 for curing the sealant according to this embodiment is made from quartz with lower refractive index than glass, and has certain thickness.

First light non-transmittable layers M11 are formed on a first surface of the mask M10 corresponding to the glass 21, and second light non-transmittable layers M12 are formed on a second surface which is opposite to the first surface. The first light non-transmittable layers M11 are one-to-one corresponded to the second light non-transmittable layers M12. A pair of these first light non-transmittable layers M11 and second light non-transmittable layers M12 corresponded to each other correspond to one of the active areas A formed on the substrate 10. The first and second light non-transmittable layers M11 and M12 are molybdenum (Mo) thin film or chrome (Cr) thin film formed through sputtering or sand blasting process.

On the other hand, it is desirable that the width (area) of the first light non-transmittable layers M11 formed on the first surface of the mask M10 corresponding to the glass is larger than that of the second light non-transmittable layers M12 formed on the second surface which is opposite to the first surface.

Figure 4:
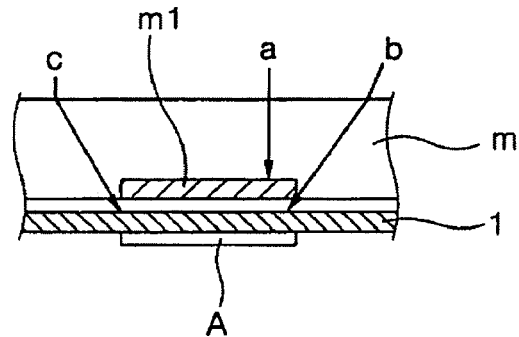
FIG. 4 is a partial, enlarged view of the mask and substrate for illustrating the path of ultraviolet rays.

As in FIG. 4, ultraviolet rays can be irradiated perpendicularly to the mask M10. Also, ultraviolet rays can be irradiated slantly with a certain incident angle to the mask M10, and then refracted on the surface of the mask M10. In this embodiment, the ultraviolet rays refracted on the surface of the mask M10 is intercepted by the first light non-transmittable layers M11 formed on the first surface of the mask M10. Accordingly, ultraviolet rays are not irradiated to the active areas A of the substrate 10.

Also, the ultraviolet rays to be refracted and irradiated to the active region A of the substrate 10 are intercepted by the second light non-transmittable layers M12, and so cannot be irradiated on the active areas A of the substrate 10 located below the second light non-transmittable layers M12.

The ultraviolet rays penetrating other region of the mask M10 than the light non-transmittable layers M11 and M12 penetrate the glass 21 and are irradiated on the sealant S-dispensed region, thereby curing the sealant S. At this time, the ultraviolet rays are irradiated on the sealant S without any effect to the metal lines since the sealant S is dispensed on the metal lines extended from the ITO layers and the metal layers in the active area and formed on the cap-bonding region (S1 and S2 of FIG. 2). Accordingly, the entire sealant S dispensed on the cap-bonding region is completely cured by the ultraviolet rays, and so the glass 21 and the substrate 10 can maintain secure adhesion state.

As described in the above first and second embodiments, each active area A of the substrate 10 has a structure that the metal layer (4 in FIG. 4) is deposited on the organic material layer (3 in FIG. 1). Thus, in the present invention which ultraviolet rays are irradiated to the glass corresponding to the ultraviolet lamp, the organic material layer is not exposed to ultraviolet rays by the metal layer. As a result, any damage to the organic material caused by the ultraviolet rays can be prevented.

After the process for curing the sealant is completed, the bonded substrate 10 and glass 21 is diced at the specific positions (a, b and c in FIG. 7) to make a plurality of separate organic electroluminescent devices.

In the method of bonding the glass cap according to the second and third embodiments as described above, ultraviolet rays are irradiated to the glass 21 first at the state that the glass 21 is placed toward the ultraviolet source, and so the sealant S dispensed on the cap-bonding region S1 and S2 of the substrate 10 can be cured completely without any effect to the metal lines. Accordingly, some margin can be secured for the width of each metal line formed on the cap-bonding region of the substrate. Also, in each active area, the organic material layer is not exposed to ultraviolet rays by the metal layer formed on the organic material layer, and so the organic material layer is not damaged.

Further, most of the ultraviolet rays to be irradiated on the active areas A of the device can be intercepted by the upper and lower light non-transmittable layers M11 and M12 of the mask M10. Thus, it is possible to obtain the sealant curing effect as well as the active area protection effect.

On the other hand, the mask shown in FIG. 7 is not only applicable to a process for bonding the glass cap but also applicable to a process for bonding the metal cap using the sealant.

Figure 8:
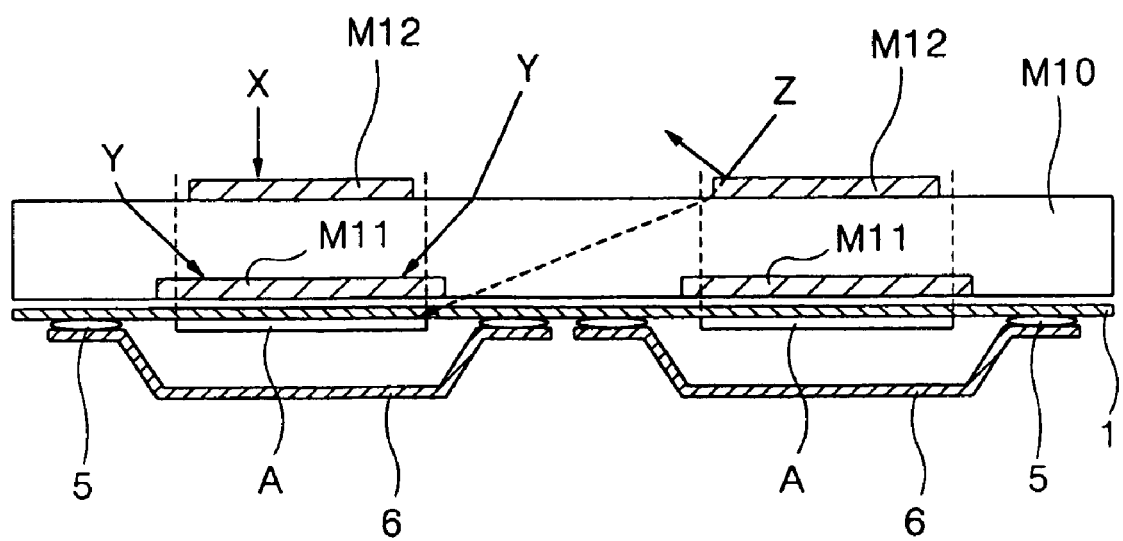
FIG. 8 is a view showing a state that a metal cap is bonded to a substrate by means of the mask shown in FIG. 7.

FIG. 8 is a view showing that a metal cap is bonded to a substrate by using the mask in the third embodiment, and for convenience, only two metal caps 6 bonded to the substrate 1 are shown therein.

As shown in FIG. 7 and described in the third embodiment, the first light non-transmittable layers M11 are formed on the first surface of the mask M10 corresponding to the glass 21 and the second light non-transmittable layers M12 are formed on the second surface which is opposite to the first surface.

The mask M10 for curing the sealant is made from quartz having lower refractive index than glass and has certain thickness. The first light non-transmittable layers M11 formed on the first surface are one-to-one corresponded to the second light non-transmittable layers M12 formed on the second surface of the mask M10, each of the first light non-transmittable layers M11 and each of the second light non-transmittable layers M12 are corresponding to the active area A formed on the substrate 1. The first and second light non-transmittable layers M11 and M12 are molybdenum (Mo) thin film or chrome (Cr) thin film formed through sputtering or sand blasting process.

The function of the mask M10 constituted as above is described through the drawings As shown in FIG. 8, ultraviolet rays (X in FIG. 8) are irradiated perpendicularly to the mask M10, and also can be irradiated slantly with a certain incident angle to the mask and then refracted on the surface of the mask M10. The ultraviolet rays (Y in FIG. 10) refracted on the surface of the mask M10 are intercepted by the first light non-transmittable layers M11 formed on the first surface of the mask M10. Accordingly, the refracted ultraviolet rays are not irradiated to the active area A of the substrate 1.

Also, the ultraviolet rays (Z in FIG. 8) to be refracted on the surface and then irradiated to the active region A of the substrate 1 are intercepted by the second light non-transmittable layers M12, and so cannot be irradiated on the active areas A of the substrate 1 located below the light non-transmittable layers M11 and M12.

On the other hand, it is desirable to make the area (width) of each first light non-transmittable layer M11 formed on the first surface of the mask M10 larger than that of each second light non-transmittable layer M12 formed on the second surface. If the area of each second light non-transmittable layer M12 formed on the second surface of the mask M10 is larger than that of each first light non-transmittable layer M11 formed on the first surface, ultraviolet rays may not be irradiated to the sealant dispensed on the sealant-dispensing region of the cap 6 or the cap-bonding region (S1 and S2 in FIG. 2) of the substrate 1. In the case, the sealant may not be cured completely.

As described above, if the mask M10 for curing the sealant used in the third embodiment is used in the process for bonding the metal cap, most of the ultraviolet rays to be irradiated on the active areas A of the device can be intercepted by the upper (second) and lower (first) light non-transmittable layers M12 and M11 of the mask M10, and so it is possible to obtain the sealant curing effect as well as the active area protection effect.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. A method for bonding a glass cap used for sealing active areas formed on a substrate, the method comprising;
    forming a plurality of recesses on a first surface of the glass cap for sealing the active areas;
    forming a plurality of light non-transmittable layers directly on a second surface of the glass cap so that the light non-transmittable layers are one-to-one corresponded to only the active areas formed on the substrate and not corresponded to areas between the active areas, wherein the second surface is on the opposite side of the recesses;
    dispensing a sealant on a glass cap-bonding region of the substrate;
    bonding the glass cap to the substrate in the state that each active area formed on the substrate is received in each recess of the glass cap;
    curing the sealant by irradiating ultraviolet rays to the second surface of the glass cap; and
    dicing the bonded glass cap and the substrate at a location where the glass cap is bonded to the substrate by the sealant to make individual devices,
    wherein the light non-transmittable layers are formed only over the active areas and not formed over the areas between the active areas;
    wherein the each active area comprises an organic material layer and a metal layer deposited on the organic material layer,
    wherein each of the light non-transmittable layers is chrome or molybdenum thin film formed through a sand blasting process,
    wherein a plurality of metal lines extended to the metal layer are formed on the glass cap-bonding region, and the sealant is disposed under the glass cap and over the metal lines such that the substrate, the metal lines, the sealant and the glass cap are sequentially stacked from bottom to top at the glass cap-bonding region,
    wherein the ultraviolet rays are irradiated over the glass cap to pass through from the top to the bottom at the glass cap-bonding region such that the ultraviolet rays reach the sealant after penetrating the glass cap without any influence of the metal lines, and
    wherein each width of the light non-transmittable layers is substantially equal to that of the active area.

2. The method according to claim 1, wherein prior to the dicing, the glass cap has a first thickness at the location where the glass cap is bonded to the substrate by the sealant and has a second thickness where the plurality of light non-transmittable layers are formed directly on the second surface of the glass cap, and the first thickness is greater than the second thickness.

* * * * *